US012568825B2

(12) United States Patent
Seol et al.

(10) Patent No.: US 12,568,825 B2
(45) Date of Patent: Mar. 3, 2026

(54) SEMICONDUCTOR PACKAGE AND METHOD OF MANUFACTURING SEMICONDUCTOR PACKAGE

(71) Applicant: SAMSUNG ELECTRONICS CO., LTD., Suwon-si (KR)

(72) Inventors: Yongjin Seol, Suwon-si (KR); Jungeun Koo, Suwon-si (KR); Tongsuk Kim, Suwon-si (KR); Youngjun Yoon, Suwon-si (KR); Mijeong Jeong, Suwon-si (KR); Younghun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 18/115,545

(22) Filed: Feb. 28, 2023

(65) Prior Publication Data

US 2023/0361054 A1     Nov. 9, 2023

(30) Foreign Application Priority Data

May 6, 2022     (KR) ........................ 10-2022-0055918

(51) Int. Cl.
  *H01L 23/58*     (2006.01)
  *H01L 23/31*     (2006.01)
    (Continued)
(52) U.S. Cl.
  CPC ........ *H01L 23/585* (2013.01); *H01L 23/3128* (2013.01); *H01L 23/49822* (2013.01); *H01L 25/16* (2013.01); *H01Q 9/0407* (2013.01)
(58) Field of Classification Search
  None
  See application file for complete search history.

(56) References Cited

U.S. PATENT DOCUMENTS

| | | | |
|---|---|---|---|
| 10,403,511 | B2 | 9/2019 | Saraswat et al. |
| 10,644,388 | B2 | 5/2020 | Yamada et al. |

(Continued)

FOREIGN PATENT DOCUMENTS

| | | |
|---|---|---|
| CN | 111199957 A | 5/2020 |
| CN | 112071808 A | 12/2020 |

(Continued)

OTHER PUBLICATIONS

Communication dated Oct. 16, 2025 issued by the Korean Intellectual Property Office in Korean Patent Application No. 10-2022-0055918.

*Primary Examiner* — Jay C Chang

(74) *Attorney, Agent, or Firm* — Sughrue Mion, PLLC

(57) ABSTRACT

Provided is a semiconductor package including a redistribution structure including first surface and a second surface opposite to each other, the redistribution structure including a redistribution layer, a semiconductor chip on the first surface of the redistribution structure, the semiconductor chip being electrically connected to the redistribution layer, an encapsulant on the semiconductor chip, at least one antenna pattern on the encapsulant, a side wiring line extending along a surface of the encapsulant from one end of the antenna pattern to the redistribution layer, and electronic devices on the second surface of the redistribution structure, the electronic devices being electrically connected to the redistribution layer, wherein the semiconductor chip and the antenna pattern are configured to transmit and receive a signal to and from each other through the electronic devices.

17 Claims, 13 Drawing Sheets

(51)  Int. Cl.

| | |
|---|---|
| *H01L 23/498* | (2006.01) |
| *H01L 25/16* | (2023.01) |
| *H01Q 9/04* | (2006.01) |

(56)  References Cited

U.S. PATENT DOCUMENTS

| | | | |
|---|---|---|---|
| 10,685,926 B2 | 6/2020 | Lim et al. | |
| 2016/0379915 A1* | 12/2016 | Lee | H01L 23/49822 |
| | | | 257/737 |
| 2019/0252351 A1 | 8/2019 | Lin et al. | |
| 2020/0091608 A1 | 3/2020 | Alpman et al. | |
| 2020/0243441 A1 | 7/2020 | Hsiao et al. | |
| 2020/0303331 A1 | 9/2020 | Liang et al. | |
| 2020/0328167 A1 | 10/2020 | Chang Chien et al. | |
| 2020/0381812 A1* | 12/2020 | Yeh | H01L 21/565 |
| 2021/0313302 A1* | 10/2021 | Kadan | H01L 25/0753 |
| 2022/0006173 A1 | 1/2022 | Lee et al. | |
| 2022/0359420 A1* | 11/2022 | Kim | H01Q 1/2283 |

FOREIGN PATENT DOCUMENTS

| | | |
|---|---|---|
| CN | 215183915 U | 12/2021 |
| KR | 10 2021 0131477 A | 11/2021 |
| KR | 10 2022 0000329 A | 1/2022 |

* cited by examiner

SEMICONDUCTOR PACKAGE AND METHOD OF MANUFACTURING SEMICONDUCTOR PACKAGE

CROSS-REFERENCE TO RELATED APPLICATION

This application claims priority to Korean Patent Application No. 10-2022-0055918 filed on May 6, 2022 in the Korean Intellectual Property Office, the disclosure of which is incorporated herein by reference in its entirety.

BACKGROUND

One or more example embodiments relate to a semiconductor package and a method of manufacturing the semiconductor package.

In relation to mmWave communications including 5th generation (5G) communications, it is necessary to develop a semiconductor package in which an antenna and other electronic components (for example, radio frequency integrated circuit (RFIC), power management integrated circuit (PMIC), passive components, and the like) required for 5G communications are integrated, and losses of high-frequency signals are minimized.

SUMMARY

One or more example embodiments provide a semiconductor package having improved electrical properties and a reduced size, and a method of manufacturing the semiconductor package.

According to an aspect of an example embodiment, there is provided a semiconductor package including a redistribution structure including a first surface and a second surface opposite to each other, the redistribution structure including a redistribution layer, a semiconductor chip on the first surface of the redistribution structure, the semiconductor chip being electrically connected to the redistribution layer, an encapsulant on the semiconductor chip, at least one antenna pattern on the encapsulant, a side wiring line extending along a surface of the encapsulant from one end of the antenna pattern to the redistribution layer, and electronic devices on the second surface of the redistribution structure, the electronic devices being electrically connected to the redistribution layer, wherein the semiconductor chip and the antenna pattern are configured to transmit and receive a signal to and from each other through the electronic devices.

According to another aspect of an example embodiment, there is provided a semiconductor package including a redistribution structure including a first surface and a second surface opposite to each other, the redistribution structure including a redistribution layer, a semiconductor chip on the first surface of the redistribution structure, the semiconductor chip being electrically connected to the redistribution layer, an encapsulant on the semiconductor chip, at least one antenna pattern on the encapsulant, the antenna pattern including a first end and a second end spaced apart from each other, a first side wiring line extending from the first end of the antenna pattern to the redistribution layer, a second side wiring line extending from the second end of the antenna pattern to the redistribution layer, and electronic devices including first devices on the second surface of the redistribution structure and electrically connected to the first side wiring line through the redistribution layer, and second devices electrically connected to the second side wiring line through the redistribution layer.

According to another aspect of an example embodiment, there is provided a semiconductor package including a redistribution structure including a first surface and a second surface opposite to each other, the redistribution structure including an insulating layer and a redistribution layer in the insulating layer, a semiconductor chip on the first surface of the redistribution structure, the semiconductor chip being electrically connected to the redistribution layer, an encapsulant on the semiconductor chip on the first surface, at least one antenna pattern on the encapsulant, and a side wiring line including a first side surface extending from one end of the antenna pattern to the redistribution layer, the first side surface being in contact with the one end of the antenna pattern, the encapsulant, and the insulating layer, and a second side surface opposite to the first side surface, the second side surface being exposed from the encapsulant and the insulating layer.

According to another aspect of an example embodiment, there is provided a method of manufacturing a semiconductor package, the method including forming package structures divided by a sawing line, the package structures respectively including a redistribution structure, a semiconductor chip on a first surface of the redistribution structure, and an encapsulant on the semiconductor chip, forming an antenna pattern on the package structures, forming holes intersecting the sawing line and adjacent to an end of the antenna pattern, forming a conductive material layer in the holes, and separating the package structures from each other by cutting along the sawing line.

BRIEF DESCRIPTION OF DRAWINGS

The above and other aspects, features, and advantages of the embodiments will be more clearly understood from the following detailed description, taken in conjunction with the accompanying drawings, in which.

DETAILED DESCRIPTION

Hereinafter, preferred example embodiments will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1A:
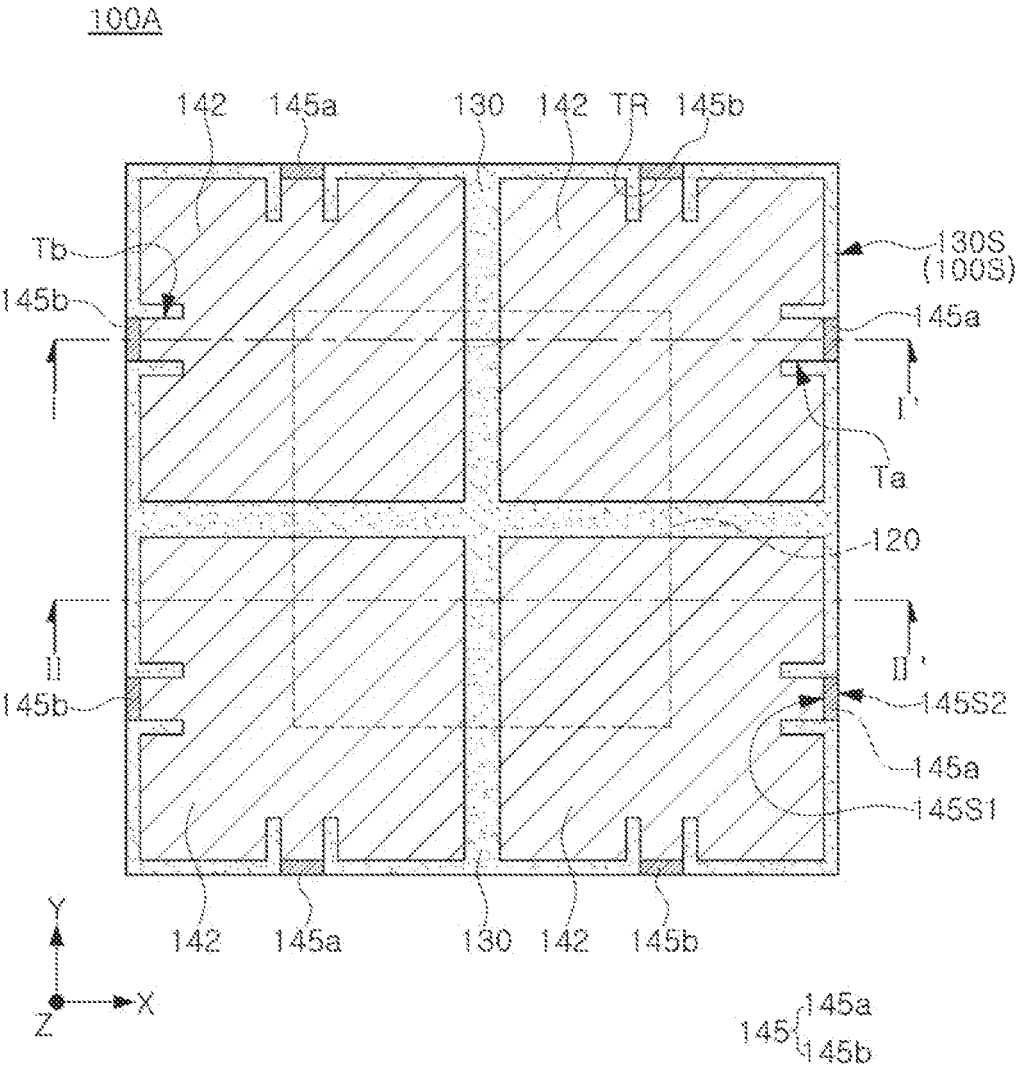
FIG. 1A is a plan view illustrating a semiconductor package according to an example embodiment.
Figure 1B:
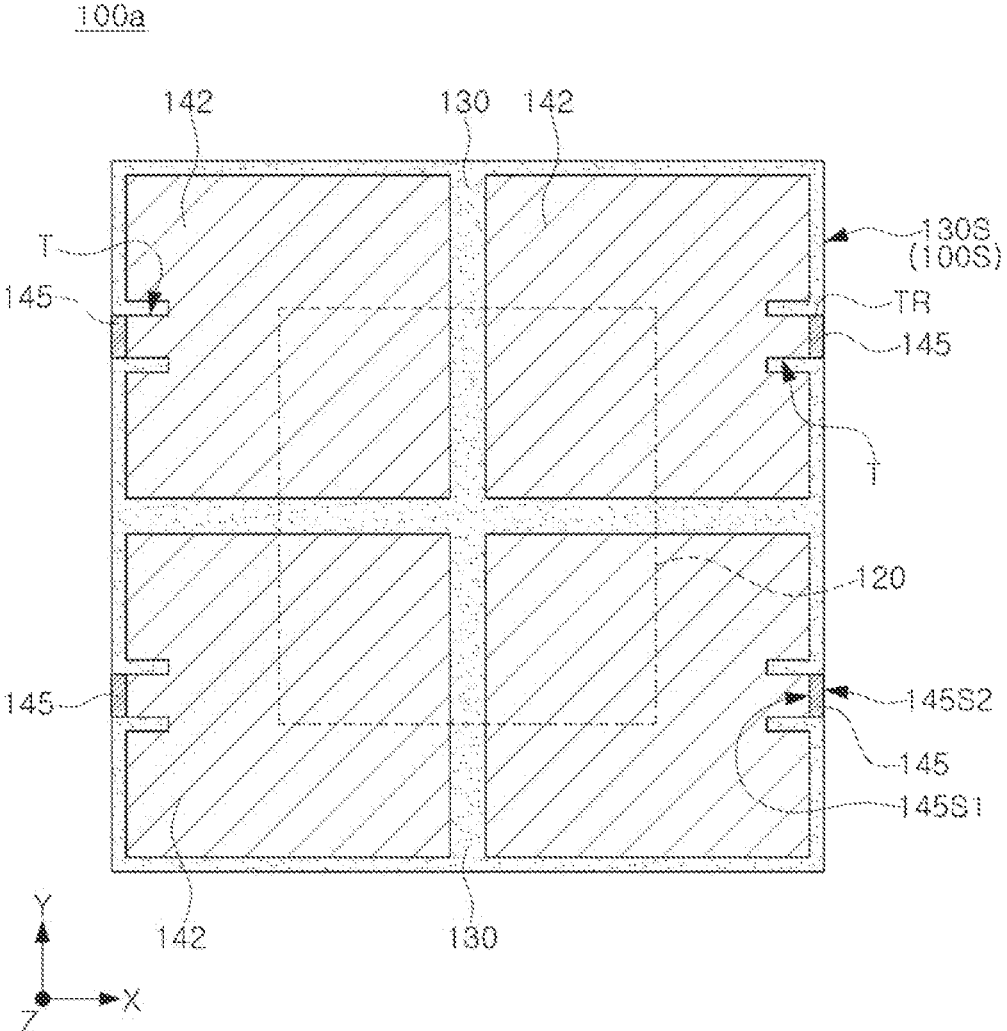
FIG. 1B is a plan view illustrating a semiconductor package according to another example embodiment.
Figure 2A:
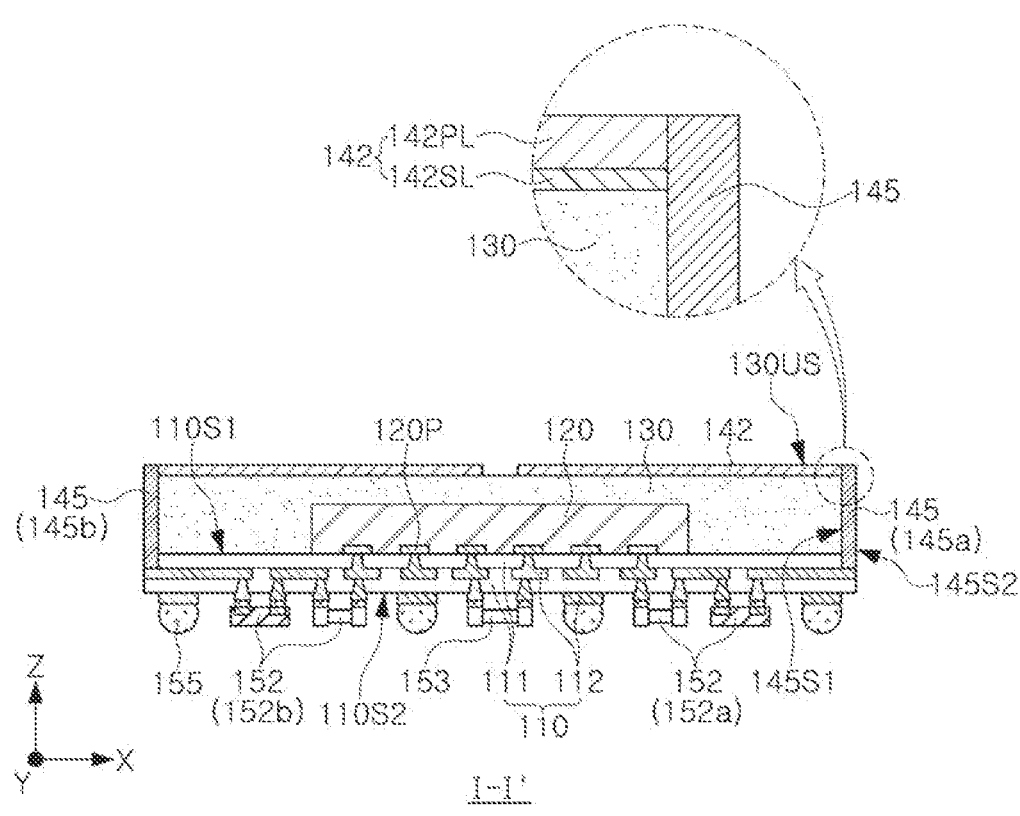
FIG. 2A is a cross-sectional view taken along line II' in FIG. 1A.
Figure 2B:
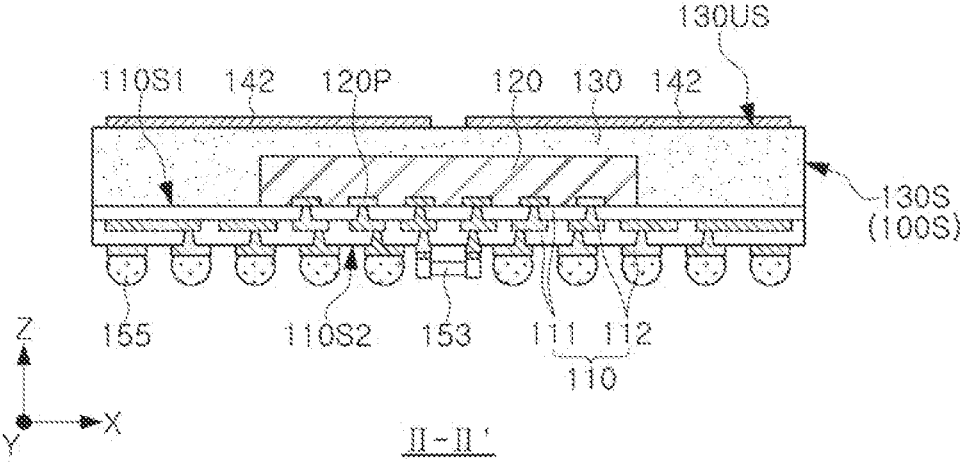
FIG. 2B is a cross-sectional view taken along line II-II' in FIG. 1A.

FIG. 1A is a plan view illustrating a semiconductor package according to an example embodiment, and FIG. 1B is a plan view illustrating a semiconductor package according to another example embodiment. FIG. 2A is a cross-sectional view taken along line I-I' in FIG. 1A, and FIG. 2B is a cross-sectional view taken along line II-II' in FIG. 1A;

Referring to FIGS. 1A, 1B, 2A, and 2B, a semiconductor package 100A according to an example embodiment may include a redistribution structure 110, a semiconductor chip 120, an encapsulant 130, an antenna pattern 142, and a side wiring line 145. In addition, the semiconductor package 100A may further include electronic devices 152 and a connection bump 155. According to example embodiments, the antenna pattern 142 may be directly formed on a rear surface of the semiconductor package 100A without manufacturing an antenna substrate, thereby reducing manufacturing costs of the semiconductor package 100A integrated with an antenna. In addition, the antenna pattern 142 may be connected to the redistribution layer 112 and the electronic devices 152 on a front surface of the semiconductor package 100A using the side wiring line 145 extending along a side surface of the semiconductor package 100A, thereby reducing thickness and improving electrical properties of the semiconductor package 100A.

The redistribution structure 110 may have a first surface 110S1 and a second surface 110S2 opposite to each other, and may include an insulating layer 111 and a redistribution layer 112 in the insulating layer 111.

The insulating layer 111 may include an insulating material, for example, a thermosetting resin such as an epoxy resin, a thermoplastic resin such as polyimide, or a resin in which these resins are impregnated with an inorganic filler and/or a glass fiber (or a glass cloth or a glass fabric), for example, a prepreg, an Ajinomoto build-up film (ABF), FR-4, bismaleimide triazine (BT), or the like. In some example embodiments, the insulating layer 111 may include a photosensitive resin such as a photoimageable dielectric (PID). The photosensitive resin may include, for example, at least one of photosensitive polyimide, polybenzoxazole, a phenol-based polymer, or a benzocyclobutene-based polymer. The insulating layer 111 may include more or fewer layers than those illustrated in the drawings. Depending on the process, an interface between a plurality of insulating layers 111 may not be clearly distinguished and the plurality of insulating layers 111 may be integrally formed.

The redistribution layer 112 may redistribute a connection pad 120P of the semiconductor chip 120 and provide a signal transmission path between the semiconductor chip 120 and the antenna pattern 142. The redistribution layer 112 may include, for example, a metal material including copper (Cu), aluminum (Al), silver (Ag), tin (Sn), gold (Au), nickel (Ni), lead (Pb), titanium (Ti), or an alloy thereof. The redistribution layer 112 may include a ground pattern, a power pattern, and a signal pattern. The redistribution layer 112 may include layers more or fewer than those illustrated in the drawings. The redistribution layer 112 may be integrally formed with a via passing through the insulating layer 111, but embodiments are not limited thereto.

The semiconductor chip 120 may be disposed on a first surface 110S1 of the redistribution structure 110, and may be electrically connected to the redistribution layer 112. The semiconductor chip 120 may be disposed such that an active surface thereof on which the connection pad 120P is disposed to face the first surface 110S1 of the redistribution structure 110. The semiconductor chip 120 may include an integrated circuit for transmitting and receiving a signal to and from the antenna pattern 142. For example, the semiconductor chip 120 may be a radio-frequency integrated circuit (RFIC) chip that may transmit an RF signal to the antenna pattern 142 and receive the RF signal from the antenna pattern 142.

The encapsulant 130 may be provided on the semiconductor chip 120 and on the first surface 110S1 of the redistribution structure 110. The encapsulant 130 may cover the upper surface and the side surfaces of the semiconductor chip 120 and the exposed first surface 110S1 of the redistribution structure 110. The encapsulant 130 may include an insulating material. The insulating material may include a thermosetting resin such as an epoxy resin, a thermoplastic resin such as polyimide, or a material in which these resins are impregnated with an inorganic filler and/or a glass fiber, for example, a prepreg, an ABF, FR-4, BT, an epoxy molding compound (EMC), or the like. In some example embodiments, the encapsulant 130 may include a non-photosensitive resin such as the ABF or the EMC. A trench TR filled with the side wiring line 145 may be formed on a side surface 130S of the encapsulant 130. The trench TR may extend from an upper surface 130US of the encapsulant 130 toward the first surface 110S1 of the redistribution structure 110.

The antenna pattern 142 may be disposed on the encapsulant 130. The antenna pattern 142 may include at least one patch antenna forming broadside radiation. In some example embodiments, the antenna pattern 142 may form a planar antenna array in which a plurality of antenna patterns 142 are arranged in a matrix on the encapsulant 130. For example, the antenna pattern 142 may have a flat sheet shape having a large area as compared to a thickness thereof. However, the type and shape of the antenna pattern 142 is not limited to the above description, and may be changed in various manners.

The antenna pattern 142 may include a conductive material such as copper (Cu), aluminum (Al), silver (Ag), tin (Sn), gold (Au), nickel (Ni), lead (Pb), titanium (Ti), or an alloy thereof. In some example embodiments, as illustrated in FIG. 2A, the antenna pattern 142 may include a seed layer 142SL on the encapsulant 130 and a plating layer 142PL stacked on the seed layer 142SL opposite to the encapsulant 130. For example, the seed layer 142SL may include titanium (Ti) or a titanium (Ti) alloy, and the plating layer 142PL may include copper (Cu) or a copper (Cu) alloy.

One end T of the antenna pattern 142 may be connected to the side wiring line 145. In some example embodiments, the antenna pattern 142 may be connected to one or two or more side wiring lines 145. For example, as illustrated in FIG. 1A, the antenna pattern 142 may have a first end Ta and a second end Tb spaced apart from each other, and the first end Ta and the second end Tb may be in contact with the first side wiring line 145a and the second side wiring line 145b, respectively. In this case, the first side wiring line 145a and the second side wiring line 145b may be used as a wiring line for transmission or a wiring line for reception, respectively. For example, the first side wiring line 145a may be configured to transmit a signal generated by the semiconductor chip 120 to the antenna pattern 142, and the second side wiring line 145*b* may be configured to transmit a signal received by the antenna pattern 142 to the semiconductor chip 120, but embodiments are not limited thereto.

In addition, as illustrated in FIG. 1B, the antenna pattern 142 may be connected to one side wiring line 145 at one end T thereof. In this case, the side wiring line 145 may be used as a wiring line for transmission and a wiring line for reception by an RF switch. In some example embodiments, the antenna patterns 142 illustrated in FIGS. 1A and 1B may be interchangeably used. Hereinafter, features equally applied to the antenna patterns 142 of FIGS. 1A and 1B will be described with reference to the one end T of the antenna pattern 142, and features applied only to the antenna pattern 142 of FIG. 1A will be described with reference to the first end Ta and the second end Tb of the antenna pattern 142.

The side wiring line 145 may extend along a surface of the encapsulant 130 from one end of the antenna pattern 142 to the redistribution layer 112, and may provide a signal transmission path between the semiconductor chip 120 and the antenna pattern 142. The side wiring line 145 may be electrically connected to the electronic devices 152 mounted on the second surface 110S2 of the redistribution structure 110 through the redistribution layer 112. The side wiring line 145 may include a conductive material such as copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or the like. In example embodiments, the side wiring line 145 extending along the surface of the encapsulant 130 may be provided without forming a via passing through the encapsulant 130, thereby lowering a process difficulty level and improving a yield, which will be described below with reference to FIGS. 9 to 14B.

The side wiring line 145 may extend along a side surface of the encapsulant 130 extending toward the first surface 110S1 from the upper surface 130US of the encapsulant 130 opposite to the first surface 110S1 of the redistribution structure 110. The side wiring line 145 may be disposed in the trench TR extending along at least portions of the side surface 130S of the encapsulant 130 and the insulating layer 111 of the redistribution structure 110. Accordingly, one side of the side wiring line 145 may be in contact with the antenna pattern 142, the encapsulant 130, and the insulating layer 111, and the other side may be exposed therefrom. For example, the side wiring line 145 may have a first side surface 145S1 in contact with the one end T of the antenna pattern 142, the encapsulant 130, and the insulating layer 111, and a second side surface 145S2 opposite to the first side surface 145S1 and exposed from the encapsulant 130 and the insulating layer 111. In a plan view, the trench TR may have a bottom surface provided by the one end T of the antenna pattern 142 and a side surface provided by the encapsulant 130 (see FIG. 1B). The side wiring line 145 may be in contact with the one end T of the antenna pattern 142 providing the bottom surface of the trench TR. Here, the second side surface 145S2 of the side wiring line 145 may be coplanar with a side surface ("100S" in FIG. 2B) of the semiconductor package 100A provided by the encapsulant 130 and the insulating layer 111.

The electronic devices 152 may be disposed on the second surface 110S2 of the redistribution structure 110, and may be electrically connected to the redistribution layer 112. The semiconductor chip 120 and the antenna pattern 142 may be configured to transmit and receive a signal to and from each other through the electronic devices 152. The electronic devices 152 may include at least one of a power amp module (PAM), a frequency filter, an RF switch, and passive devices.

As illustrated in FIG. 1A, when the antenna pattern 142 is connected to the first side wiring line 145*a* and the second side wiring line 145*b*, the electronic devices 152 may include first devices 152*a* electrically connected to the first side wiring line 145*a*, and second devices 152*b* electrically connected to the second side wiring line 145*b*. Here, when the first side wiring line 145*a* is configured to transmit a signal generated by the semiconductor chip 120 to the antenna pattern 142, and the second side wiring line 145*b* is configured to transmit a signal received by the antenna pattern 142 to the semiconductor chip 120, the first devices 152*a* may include a PAM, a frequency filter, an RF switch, and a passive device (for example, an inductor, a capacitor, or the like), and the second devices 152*b* may include a frequency filter, an RF switch, and a passive device (for example, an inductor, a capacitor, or the like).

As illustrated in FIG. 1B, when the antenna pattern 142 is connected to one side wiring line 145, the electronic devices 152 may include a PAM, a frequency filter, an RF switch, and a passive device. Here, the side wiring line 145 may be configured to transmit a signal generated by the semiconductor chip 120 to the antenna pattern 142, and the second side wiring line 145*b* may be configured to transmit a signal received by the antenna pattern 142 to the semiconductor chip 120.

As described above, the electronic devices 152 required for signal transmission and reception may be mounted on the other side of the semiconductor chip 120 with respect to the redistribution structure 110, thereby minimizing a mounting area of the semiconductor package 100A. In addition, a signal transmission path passing through the electronic devices 152 may be minimized, and electrical properties of the semiconductor package 100A may be improved.

In some example embodiments, a passive device 153 connected to the semiconductor chip 120 through the redistribution layer 112 may be further mounted on the second surface 110S2 of the redistribution structure 110. The passive device 153 may provide an impedance to the semiconductor chip 120. The passive device 153 may include a capacitor, an inductor, a chip resistor, or the like.

The connection bump 155 may be disposed on the second surface 110S2 of the redistribution structure 110, and may be electrically connected to the redistribution layer 112. The connection bump 155 may have a land, ball, or pin shape. The connection bump 155 may include a low-melting-point metal, for example, tin (Sn) or an alloy (Sn—Ag—Cu) including tin (Sn).

Figure 3:
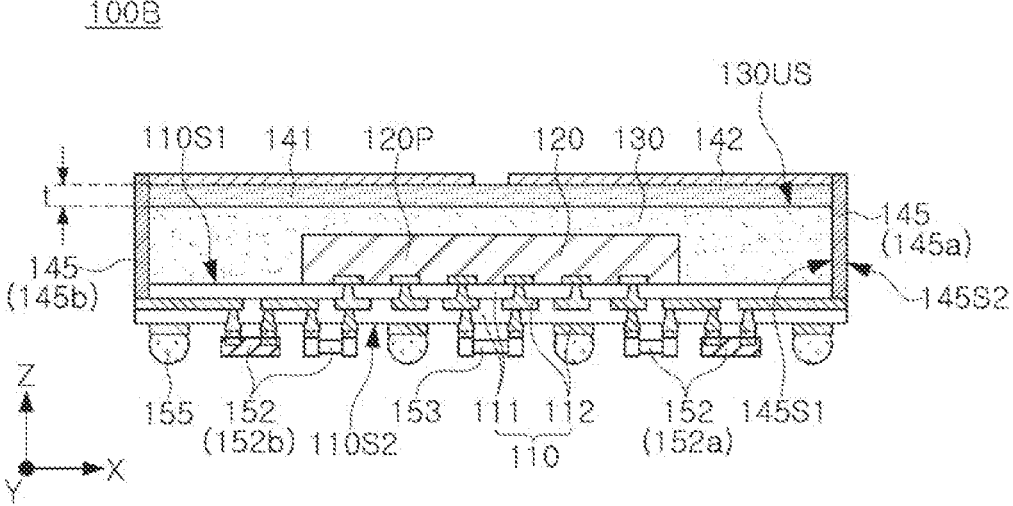
FIG. 3 is a cross-sectional view illustrating a semiconductor package according to an example embodiment.

FIG. 3 is a cross-sectional view illustrating a semiconductor package 100B according to an example embodiment. FIG. 3 illustrates a cross-section of the semiconductor package 100B corresponding to FIG. 2A.

Referring to FIG. 3, the semiconductor package 100B according to an example embodiment may have the same as or similar features to those described with reference to FIGS. 1A to 2B. The semiconductor package 100B may further include a dielectric layer 141 disposed between the encapsulant 130 and the antenna pattern 142.

The semiconductor package 100B according to the example embodiment may adjust a dielectric constant between the antenna pattern 142 and the redistribution layer 112 by introducing the dielectric layer 141 into a lower portion of the antenna pattern 142. To this end, the dielectric layer 141 may have a thickness t of about 100 μm or more in a direction (Z-direction) perpendicular to the first surface 110S1 of the redistribution structure 110. For example, the thickness t of the dielectric layer 141 may have a range of about 100 μm to about 500 μm, about 200 μm to about 400 μm, or about 200 μm to about 300 μm.

The dielectric layer 141 may include a photosensitive resin such as PID. In this case, a miniaturized and thinned antenna pattern 142 may be implemented depending on a design. However, the material of the dielectric layer 141 is not particularly limited.

In the example embodiment, the side wiring line 145 may extend along a side surface of the dielectric layer 141 and the side surface of the encapsulant 130. Accordingly, the side wiring line 145 may have a first side surface 145S1 in contact with the dielectric layer 141, the encapsulant 130, and the insulating layer 111.

Figure 4:
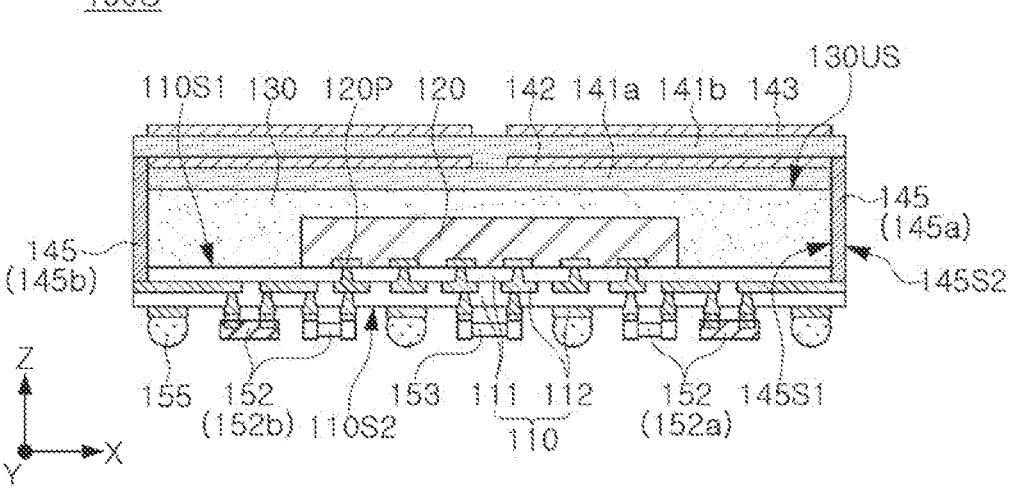
FIG. 4 is a cross-sectional view illustrating a semiconductor package according to an example embodiment.

FIG. 4 is a cross-sectional view illustrating a semiconductor package 100C according to an example embodiment. FIG. 4 illustrates a cross-section of the semiconductor package 100C corresponding to FIG. 2A.

Referring to FIG. 4, the semiconductor package 100C according to an example embodiment may have the same as or similar features to those described with reference to FIGS. 1A to 3. The semiconductor package 100C may further include a director pattern 143 disposed on the antenna pattern 142 and a second dielectric layer 141b between the antenna pattern 142 and the director pattern 143. The semiconductor package 100C according to the present example embodiment may include a first dielectric layer 141a disposed between the antenna pattern 142 and the encapsulant 130, a second dielectric layer 141b covering the antenna pattern 142 on the first dielectric layer 141a, and a director pattern 143 disposed on the second dielectric layer 141b.

The second dielectric layer 141b may be formed by applying a planarization process (for example, a CMP process) to the antenna pattern 142 and the side wiring line 145, and then applying an insulating resin. The second dielectric layer 141b may include a photosensitive resin such as PID, but embodiments are not limited thereto. In some example embodiments, the first dielectric layer 141a may be omitted, and the antenna pattern 142 may be disposed on the upper surface 130US of the encapsulant 130.

The director pattern 143 may be disposed to overlap the antenna pattern 142 in a vertical direction (Z-direction). The director pattern 143 may provide a boundary condition such that a corresponding bandwidth of the antenna pattern 142 is expanded. The director pattern 143 may be provided in various forms according to a bandwidth design standard or a size design standard of the antenna pattern 142. In some example embodiments, the number of layers of the director pattern 143 overlapping the antenna pattern 142 may be two or more.

Figure 5A:
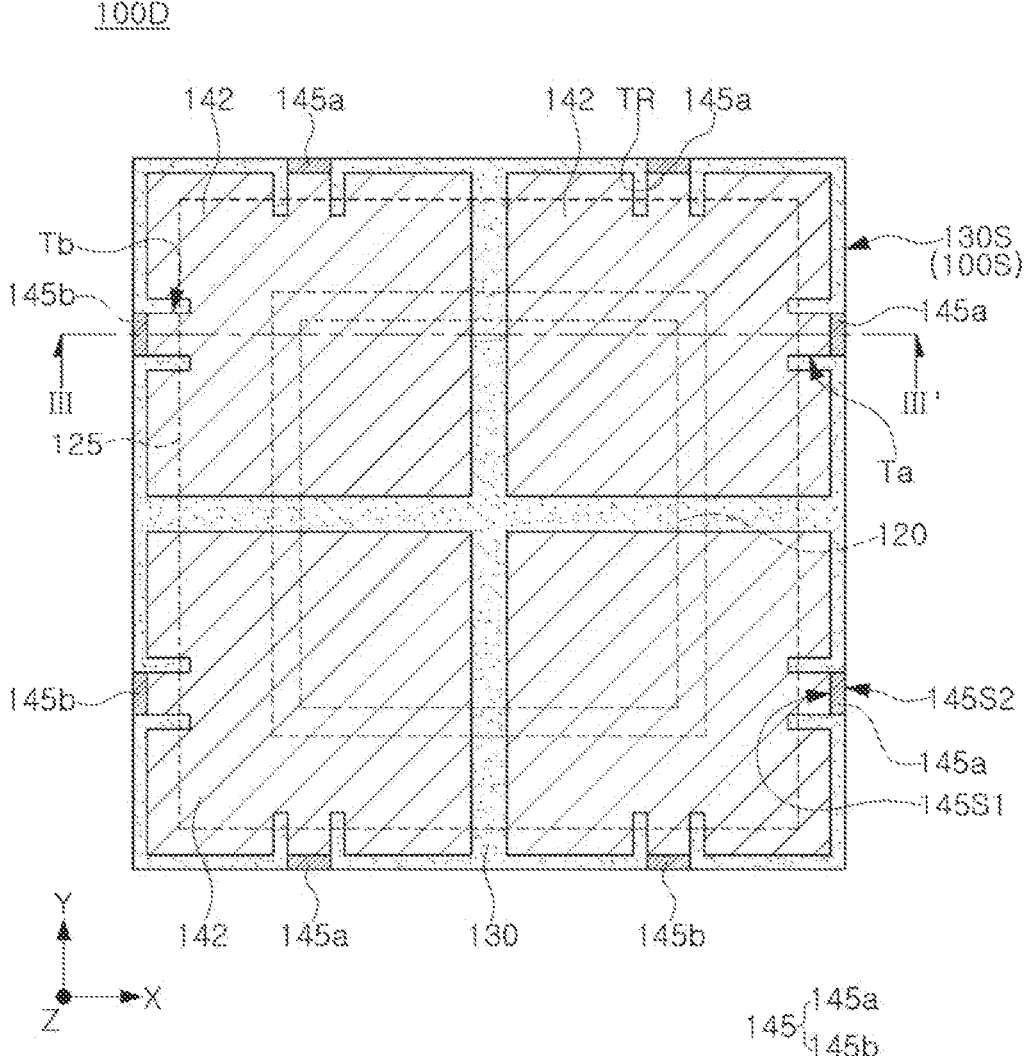
FIG. 5A is a plan view illustrating a semiconductor package according to an example embodiment.
Figure 5B:
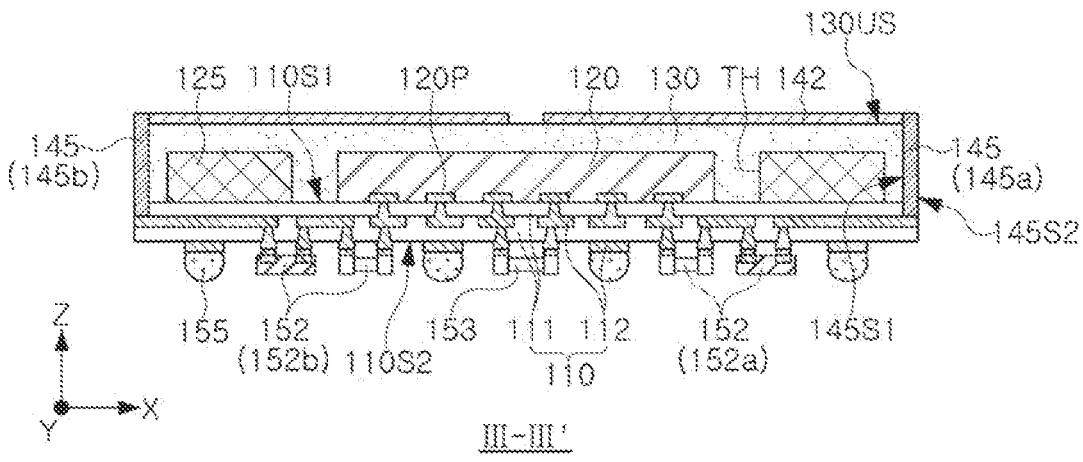
FIG. 5B is a cross-sectional view taken along line III-III' in FIG. 5A.

FIG. 5A is a plan view illustrating a semiconductor package 100D according to an example embodiment, and FIG. 5B is a cross-sectional view taken along line III-III' in FIG. 5A.

Referring to FIGS. 5A and 5B, the semiconductor package 100D according to an example embodiment may have the same as or similar features to those described with reference to FIGS. 1A to 4. The semiconductor package 100D may further include a core member 125 disposed on the first surface 110S1 of the redistribution structure 110 and surrounding the semiconductor chip 120.

The core member 125 may have a through-hole TH for accommodating the semiconductor chip 120. The core member 125 may be disposed in a fan-out area FO of the redistribution structure 110 to improve rigidity of the semiconductor package 100D and control warpage. The fan-out area FO may be an area not overlapping the semiconductor chip 120 in a vertical direction (Z-axis direction). The core member 125 may be disposed adjacent to and continuously surround a side surface of the semiconductor chip 120 as illustrated in FIG. 5A, but embodiments are not limited thereto. In some example embodiments, a plurality of core members spaced apart from each other may be disposed around the semiconductor chip 120. The core member 125 may include, for example, an insulating material such as a prepreg, an ABF, FR-4, or BT. In addition, the core member 125 may have a thickness similar to that of the semiconductor chip 120, thereby securing uniform thickness of the encapsulant 130 and minimizing thickness of a package.

Figure 6:
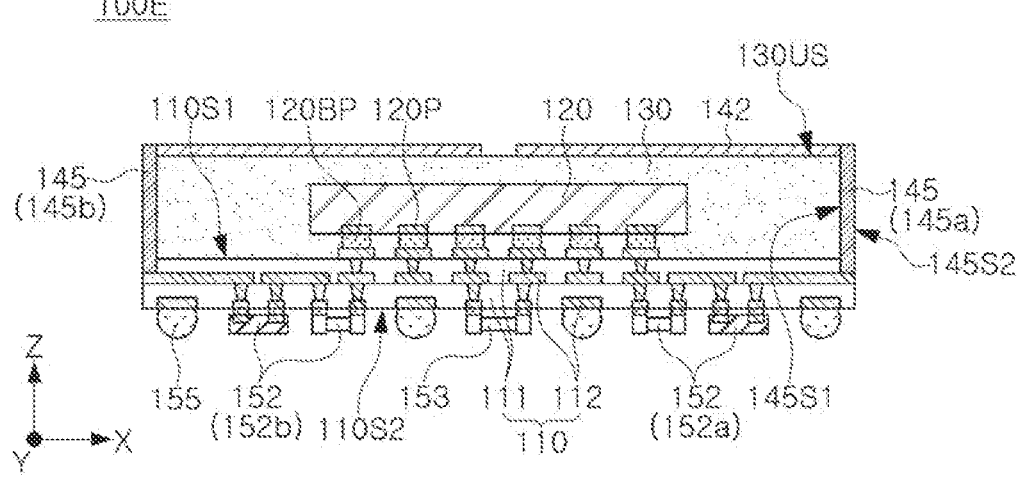
FIG. 6 is a cross-sectional view illustrating a semiconductor package according to an example embodiment.

FIG. 6 is a cross-sectional view illustrating a semiconductor package 100E according to an example embodiment. FIG. 6 illustrates a cross-section of the semiconductor package 100E corresponding to FIG. 2A.

Referring to FIG. 6, the semiconductor package 100E according to an example embodiment may have the same as or similar features to those described with reference to FIGS. 1A to 5. The semiconductor package 100E may further include bumps 120BP disposed between the semiconductor chip 120 and the redistribution structure 110. In the example embodiment, the semiconductor chip 120 may be mounted on the first surface 110S1 of the redistribution structure 110 in a flip-chip manner. An active surface of the semiconductor chip 120 and the first surface 110S1 of the redistribution structure 110 may be spaced apart from each other, and connection pads 120P may be electrically connected to the redistribution layer 112 through the bumps 120BP. The bumps 120BP may include a conductive material, and may have a land, ball, or pin shape.

Figure 7:
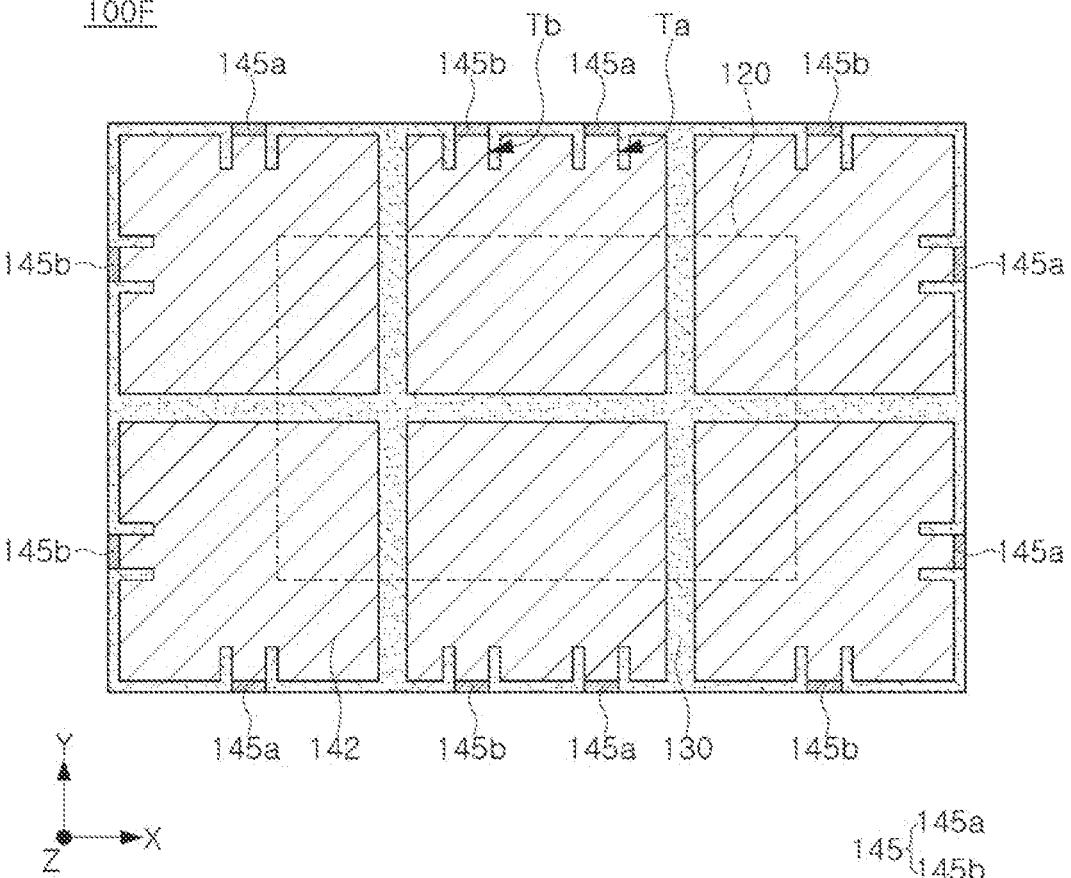
FIG. 7 is a plan view illustrating a semiconductor package according to an example embodiment.

FIG. 7 is a plan view illustrating a semiconductor package 100F according to an example embodiment.

Referring to FIG. 7, the semiconductor package 100F according to an example embodiment may have the same as or similar features to those described with reference to FIGS. 1A to 6. The number and arrangement of the antenna patterns 142 in the semiconductor package 100F may be different from those in FIGS. 1A to 6. The antenna pattern 142 may include a plurality of patch antennas disposed on the encapsulant 130. Each of the antenna patterns 142 may be in contact with the first side wiring line 145a and the second side wiring line 145b. In some example embodiments, the number of antenna patterns 142 may be greater or less than those illustrated in FIG. 7.

The antenna pattern 142 may be disposed on the encapsulant 130. The antenna pattern 142 may include at least one patch antenna forming broadside radiation. The antenna pattern 142 may form a planar antenna array in which a plurality of antenna patterns 142 are arranged in a matrix.

Figure 8:
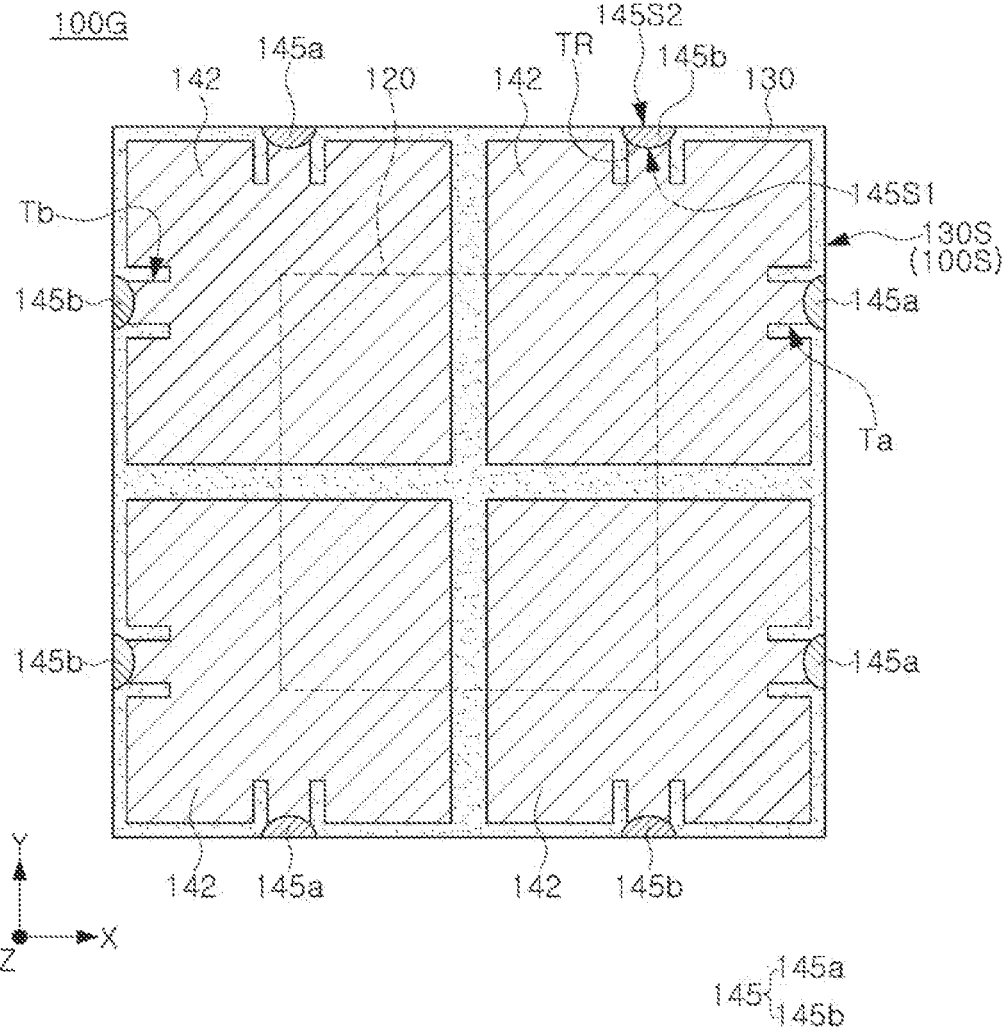
FIG. 8 is a plan view illustrating a semiconductor package according to an example embodiment.
Figure 9:
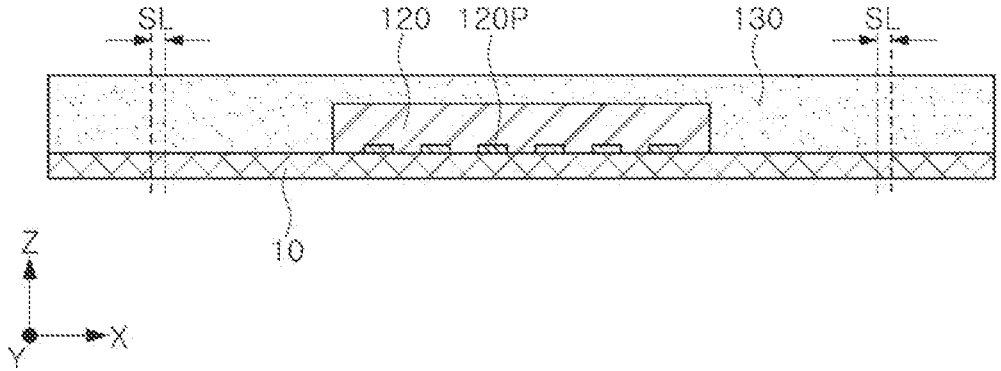
FIGS. 9, 10 and 11A-11B to 14A-14B are views illustrating a process of manufacturing a semiconductor package according to an example embodiment.

FIG. 8 is a plan view illustrating a semiconductor package 100G according to an example embodiment.

Referring to FIG. 8, the semiconductor package 100G according to an example embodiment may have the same as or similar features to those described with reference to FIGS. 1A to 7. The shape of the trench TR filled by the side wiring line 145 in the semiconductor package 100G may be different from those in FIGS. 1A to 7. In the example embodiment, the trench TR may have a curved surface protruding from ends of the encapsulant 130 and the antenna pattern 142. The side wiring line 145 may have a first side surface 145S1 being in contact with the curved surface and a second side surface 145S2 being exposed from the encapsulant 130. Accordingly, a contact area between the second side surface 145S2 and the antenna pattern 142 may be increased, and connection reliability between the side wiring line 145 and the antenna pattern 142 may be secured.

FIGS. 9 to 14B are views illustrating a manufacturing process of a semiconductor package according to an example embodiment. FIGS. 9, 10, 11A, 12A, 13A, and 14A are cross-sectional views illustrating a manufacturing process of a semiconductor package according to a process order. FIGS. 11A, 12A, 13A, and 14A illustrate cross-sections taken along cut lines A-A', B-B', C-C', and D-D' in FIGS. 11B, 12B, 13B, and 14B, respectively Referring to FIG. 9, first, the semiconductor chip 120 may be disposed on a first carrier 10 such that the connection pads 120P face the first carrier 10, and the encapsulant 130 may be formed to seal the semiconductor chip 120. The first carrier 10 may fix and support the semiconductor chip 120, and may include, for example, an adhesive tape losing adhesiveness due to ultraviolet (UV) irradiation. The encapsulant 130 may be formed by applying and curing an insulating material, for example, EMC. Thereafter, the first carrier 10 may be removed, and a redistribution structure may be formed on the semiconductor chip 120.

Figure 10:
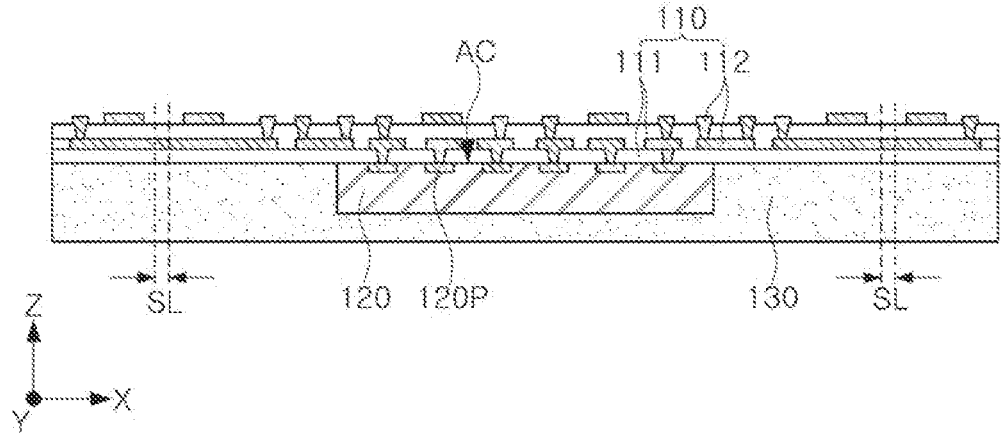

Referring to FIG. 10, the redistribution structure 110 may be formed on an active surface AC of the semiconductor chip 120. The redistribution structure 110 may be formed by sequentially stacking the insulating layer 111 and the redistribution layer 112. The insulating layer 111 may be formed, for example, by coating and curing a photosensitive resin such as PID. The redistribution layer 112 may be formed using a photolithography process, a plating process, an etching process, or the like. The redistribution layer 112 may be integrally formed with a via passing through the insulating layer 111. In some example embodiments, a solder resist layer covering the outermost redistribution layer 112 may be formed.

Figure 11A:
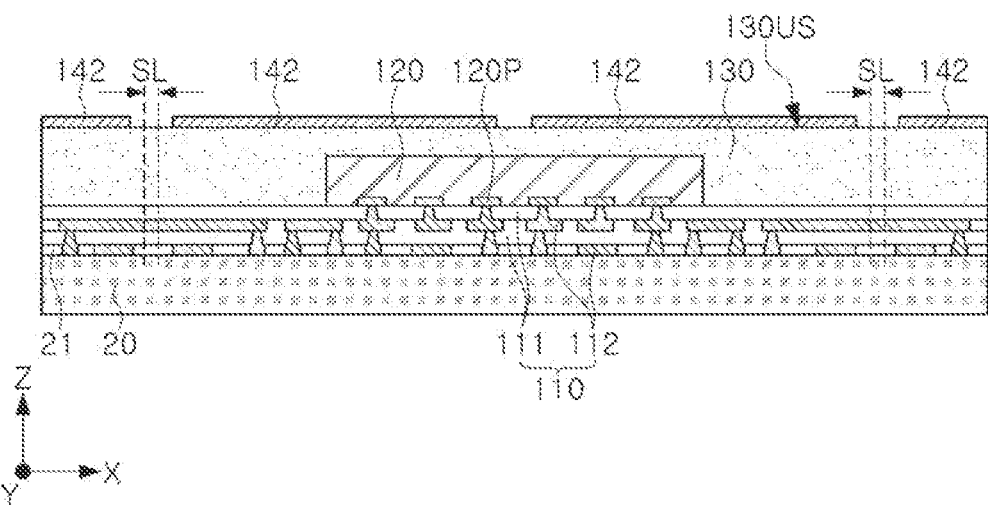
Figure 11B:
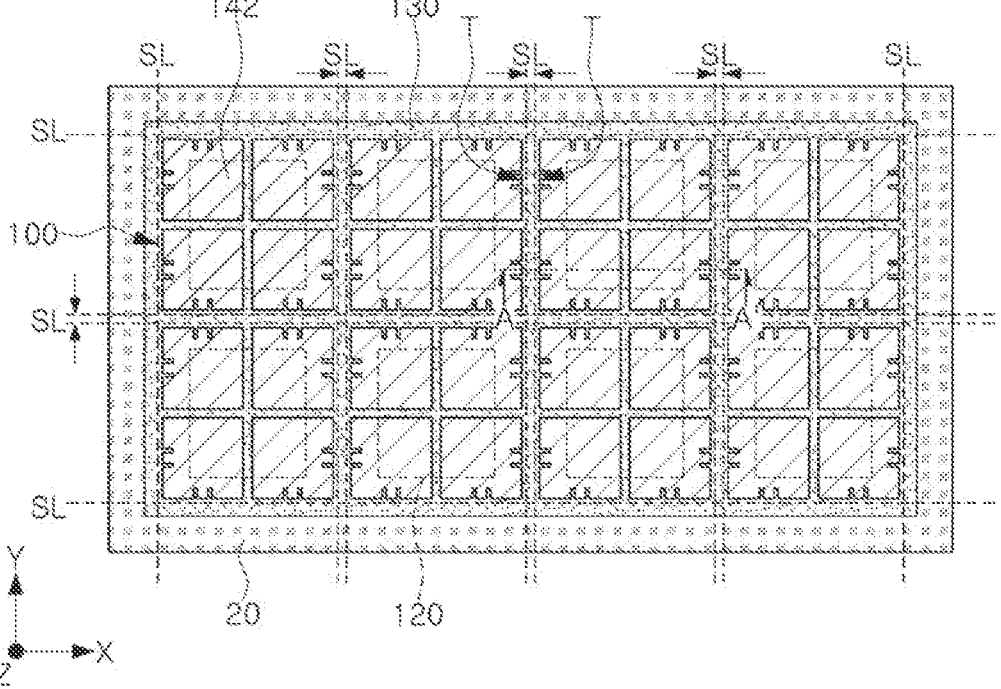

Referring to FIGS. 11A and 11B, the antenna pattern 142 may be formed on the upper surface 130US of the encapsulant 130 disposed on a second carrier 20. The redistribution structure 110 may be attached to the adhesive layer 21 such as glue. The antenna pattern 142 may be formed by patterning a conductive material on the encapsulant 130. For example, the antenna pattern 142 may be formed using a sputtering process, an electrolytic plating process, an etching process, or the like.

A plurality of package structures 100 divided by a sawing line SL may be formed on the second carrier 20. The antenna patterns 142 may be respectively formed on the plurality of package structures 100. As illustrated in FIG. 11B, the antenna patterns 142 may be patterned to be separated from each other. However, in some example embodiments, the antenna patterns 142 may be patterned such that respective ends T are connected to each other.

Figure 12A:
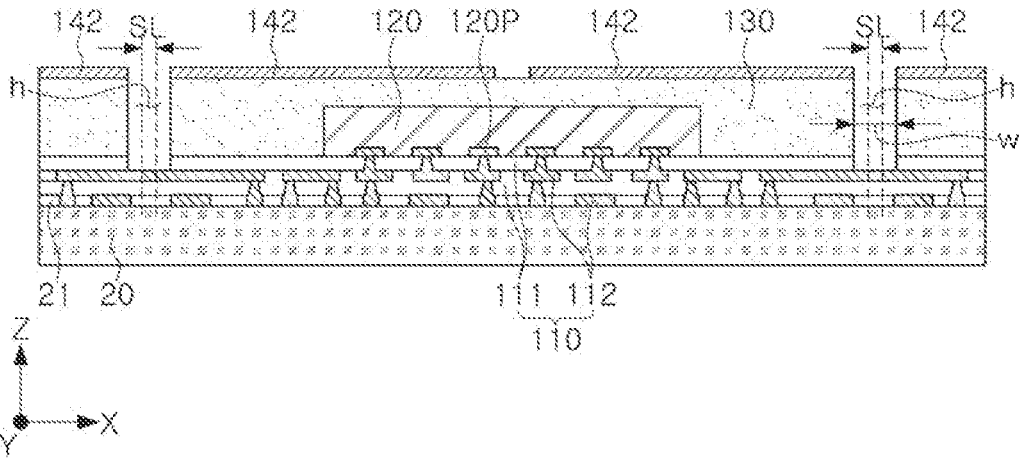
Figure 12B:
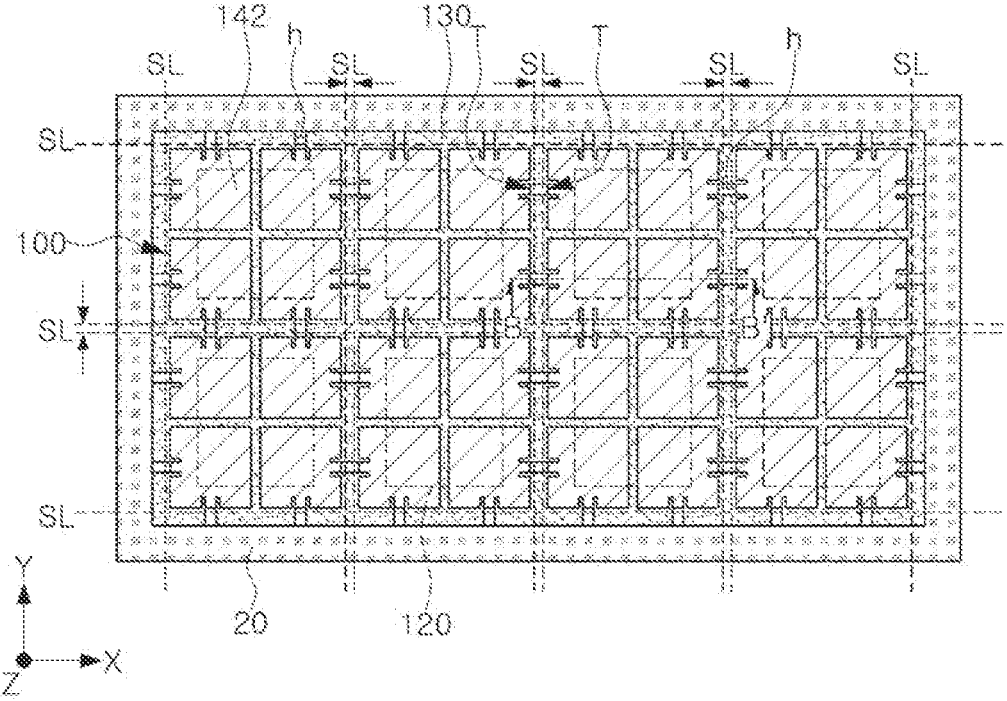

Referring to FIGS. 12A and 12B, holes h passing through portions of the encapsulant 130 and the insulating layer 111 may be formed. The holes h may be formed, for example, by forming an etch mask on the encapsulant 130 and the antenna pattern 142, and then removing a portion of each of the encapsulant 130 and the insulating layer 111 using an etching process. The holes h may be formed between the antenna patterns 142 adjacent to each other and one sides of the antenna patterns 142 adjacent to the outside of the encapsulant 130. The holes h may be formed to expose one ends T of the antenna patterns 142 in a horizontal direction (X-direction). Accordingly, the holes h may be formed to cross a saw line SL in a width direction thereof, and a width w of each of the holes h may be greater than a width of the saw line SL. The holes h may pass through at least a portion of the insulating layer 111 to expose at least a portion of the redistribution layer 112 in a vertical direction (Y-direction). In this case, the redistribution layer 112 may be used as an etch stopper, but embodiments are not limited thereto. In some example embodiments, the holes h may pass through the redistribution layer 112 to expose redistribution layer 112 in the horizontal direction (X-direction). In addition, the semiconductor chip 120 and most of the redistribution layers 112 may not be exposed through the holes h, thereby preventing contamination of the semiconductor chip 120 and the redistribution layer 112 in a subsequent process.

Figure 13A:
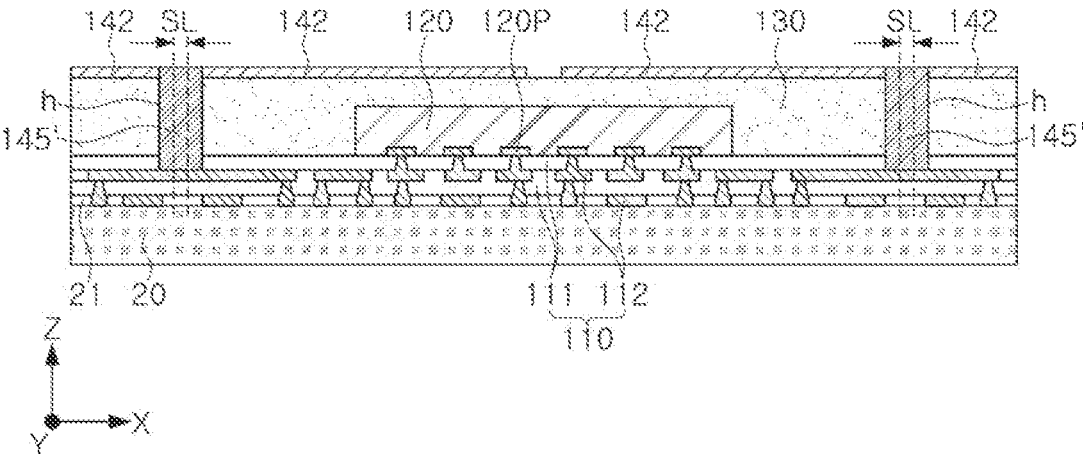
Figure 13B:
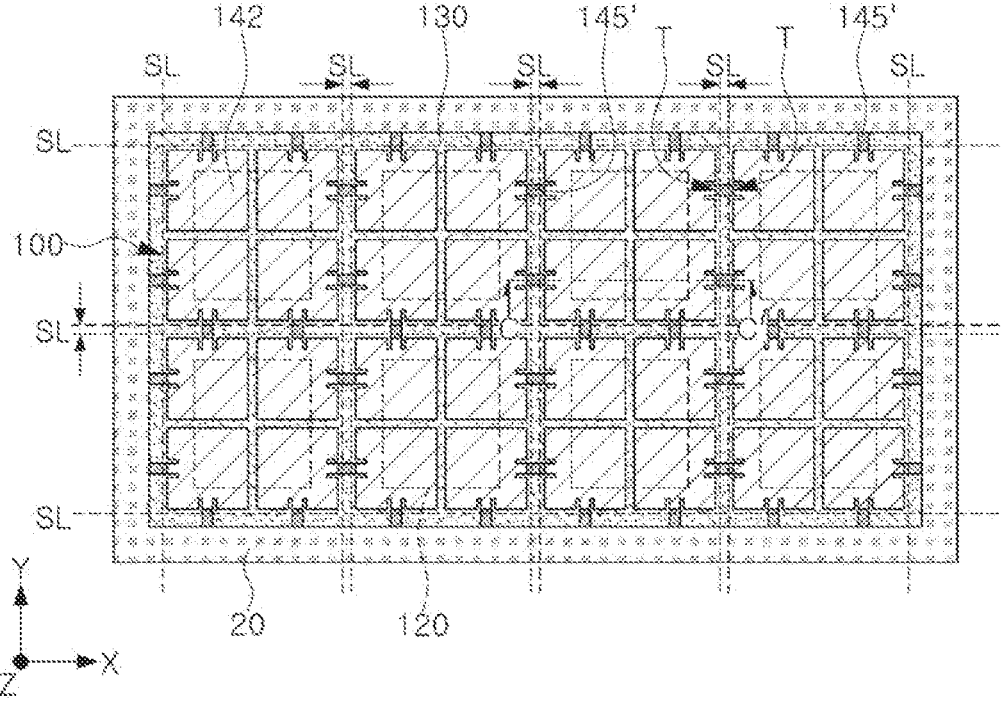

Referring to FIGS. 13A and 13B, a conductive material layer 145' may be filled in the holes h. The conductive material layer 145' may be formed by using a plating process or by injecting a conductive material, for example, a conductive paste into the holes h. The conductive material layer 145' may be in contact with the encapsulant 130 and the insulating layer 111. In addition, the conductive material layer 145' may be formed up to a level higher than that of an upper surface of the encapsulant 130, and thus may be in contact with the one end T of the antenna pattern 142.

Figure 14A:
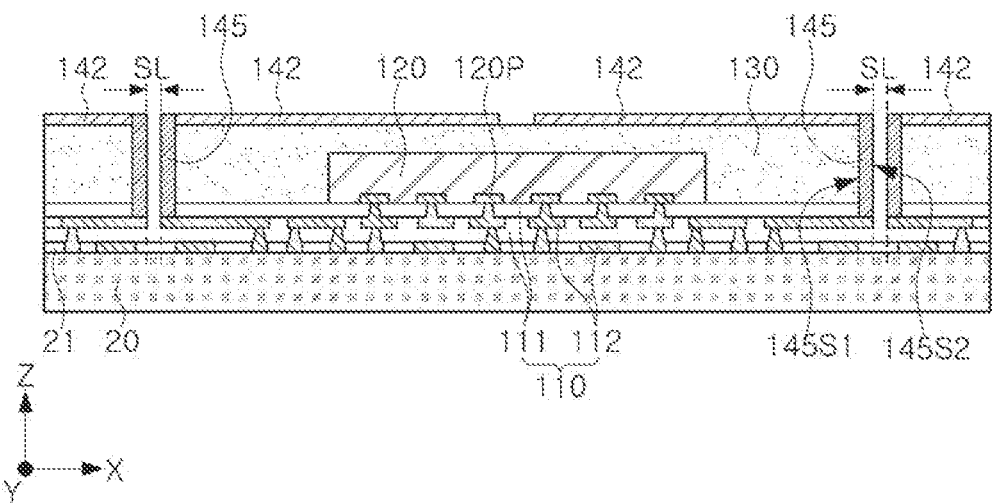
Figure 14B:
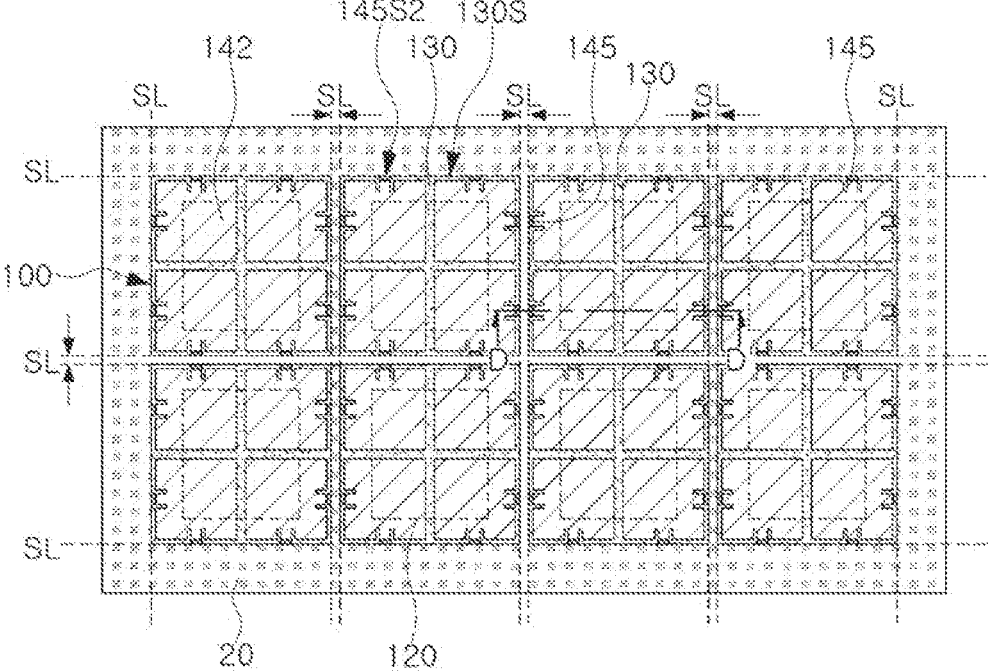

Referring to FIGS. 14A and 14B, the package structures 100 may be separated from each other by performing a sawing process. A portion of each of the conductive material layer 145', the encapsulant 130, and the redistribution structure 110 may be removed along the sawing line SL, and the package structures 100 may be separated from each other. A trench (see "TR" in FIG. 1A) extending in a vertical direction (Z-direction) and a side wiring line 145 disposed in the trench (see "TR" in FIG. 1A) may be formed on side surfaces of the package structures 100. The trench (see "TR" in FIG. 1A) may be formed by cutting the holes h in a width direction thereof. The side wiring line 145 may be formed by cutting the conductive material layer 145'. The second side surface 145S2 of the side wiring line 145 may be coplanar with the side surface 130S of the encapsulant 130. As described above, the side wiring line 145 may be formed in the sawing process for separating the package structures 100 from each other, and thus a manufacturing process of a semiconductor package may be simplified. Thereafter, the second carrier 20 may be removed, and the electronic devices 152 and the connection bumps 155 may be mounted on the second surface 110S2 of the redistribution structure 110.

While example embodiments have been shown and described above, it will be apparent to those skilled in the art that modifications and variations could be made without departing from the scope of example embodiments as defined by the appended claims and their equivalents.

What is claimed is:

1. A semiconductor package comprising:
   a redistribution structure comprising a first surface and a second surface opposite to each other, the redistribution structure comprising a redistribution layer;
   a semiconductor chip on the first surface of the redistribution structure, the semiconductor chip being electrically connected to the redistribution layer;
   an encapsulant on the semiconductor chip;
   at least one antenna pattern on the encapsulant;
   a side wiring line extending along a surface of the encapsulant from one end of the antenna pattern to the redistribution layer; and
   electronic devices on the second surface of the redistribution structure, the electronic devices being electrically connected to the redistribution layer,
   wherein the semiconductor chip and the antenna pattern are configured to transmit and receive a signal to and from each other through the electronic devices, wherein the surface of the encapsulant comprises an upper surface opposite to the first surface, and a side surface extending from the upper surface toward the first surface, wherein the side wiring line extends along the side surface of the encapsulant, and wherein the side wiring line is in a trench extending along the side surface of the encapsulant.

2. The semiconductor package of claim 1, wherein the electronic devices comprise at least one of a power amp module (PAM), a frequency filter, a radio frequency (RF) switch, and passive devices.

3. The semiconductor package of claim 1, wherein the side wiring line comprises a first side wiring line connected to a first end of the antenna pattern and a second side wiring line connected to a second end of the antenna pattern.

4. The semiconductor package of claim 3, wherein the first side wiring line is configured to transmit a signal generated by the semiconductor chip to the antenna pattern, and wherein the second side wiring line is configured to transmit a signal received by the antenna pattern to the semiconductor chip.

5. The semiconductor package of claim 1, further comprising:

a dielectric layer between the encapsulant and the antenna pattern.

6. The semiconductor package of claim 5, wherein the dielectric layer comprises a photosensitive resin, and wherein the encapsulant comprises a non-photosensitive resin.

7. The semiconductor package of claim 5, wherein a thickness of the dielectric layer is greater than or equal to 200 μm in a direction perpendicular to the first surface.

8. The semiconductor package of claim 1, wherein the antenna pattern comprises a seed layer on the encapsulant and a plating layer stacked on the seed layer.

9. The semiconductor package of claim 8, wherein the seed layer comprises titanium (Ti) or a titanium (Ti) alloy, and wherein the plating layer comprises copper (Cu) or a copper (Cu) alloy.

10. The semiconductor package of claim 1, further comprising:

a core member on the first surface of the redistribution structure and adjacent to the semiconductor chip.

11. A semiconductor package comprising:

a redistribution structure comprising a first surface and a second surface opposite to each other, the redistribution structure comprising a redistribution layer;

a semiconductor chip on the first surface of the redistribution structure, the semiconductor chip being electrically connected to the redistribution layer;

an encapsulant on the semiconductor chip;

at least one antenna pattern on the encapsulant, the antenna pattern comprising a first end and a second end spaced apart from each other;

a dielectric layer between the encapsulant and the at least one antenna pattern;

a first side wiring line extending from the first end of the antenna pattern to the redistribution layer;

a second side wiring line extending from the second end of the antenna pattern to the redistribution layer; and electronic devices comprising first devices on the second surface of the redistribution structure and electrically connected to the first side wiring line through the redistribution layer, and second devices electrically connected to the second side wiring line through the redistribution layer.

12. The semiconductor package of claim 11, wherein the first devices comprise a power amp module (PAM), a frequency filter, a radio frequency (RF) switch, and a passive device.

13. The semiconductor package of claim 11, wherein the second devices include a frequency filter, a radio frequency (RF) switch, and a passive device.

14. The semiconductor package of claim 11, wherein the first side wiring line is configured to transmit a signal generated by the semiconductor chip to the antenna pattern, and wherein the second side wiring line is configured to transmit a signal received by the antenna pattern to the semiconductor chip.

15. A semiconductor package comprising:

a redistribution structure comprising a first surface and a second surface opposite to each other, the redistribution structure comprising an insulating layer and a redistribution layer in the insulating layer;

a semiconductor chip on the first surface of the redistribution structure, the semiconductor chip being electrically connected to the redistribution layer;

an encapsulant on the semiconductor chip on the first surface;

at least one antenna pattern on the encapsulant;

a side wiring line extending from one end of the antenna pattern to the redistribution layer, the side wiring line comprising a first side surface being in contact with the one end of the antenna pattern, the encapsulant, and the insulating layer, and a second side surface opposite to the first side surface, the second side surface being exposed from the encapsulant and the insulating layer; and electronic devices on the second surface of the redistribution structure, the electronic devices being electrically connected to the redistribution layer.

16. The semiconductor package of claim 15, wherein the semiconductor package comprises a side surface provided by the encapsulant and the insulating layer, and wherein the second side surface is coplanar with the side surface of the semiconductor package.

17. The semiconductor package of claim 15, wherein the insulating layer comprises a photosensitive resin, and wherein the encapsulant comprises a non-photosensitive resin.

* * * * *